United States Patent [19]

Miyahara

[11] Patent Number: 4,789,611
[45] Date of Patent: Dec. 6, 1988

[54] METHOD FOR AMENDING A PHOTOMASK

[75] Inventor: Yutaka Miyahara, Kawasaki, Japan

[73] Assignee: Fujitsu Limited, Kawasaki, Japan

[21] Appl. No.: 941,551

[22] Filed: Dec. 11, 1986

Related U.S. Application Data

[63] Continuation of Ser. No. 756,579, Jul. 19, 1985, abandoned, which is a continuation of Ser. No. 628,115, Jul. 5, 1984, abandoned, which is a continuation of Ser. No. 501,543, Jun. 6, 1983, abandoned, which is a continuation of Ser. No. 243,542, Mar. 13, 1981, abandoned.

[30] Foreign Application Priority Data

Mar. 14, 1980 [JP] Japan .................. 55-32200

[51] Int. Cl.⁴ .............................................. G03F 9/00
[52] U.S. Cl. .................................... 430/5; 355/86; 427/53.1; 430/22; 430/30; 430/945
[58] Field of Search ............. 430/5, 945, 22, 30; 427/53.1; 355/8 G

[56] References Cited

U.S. PATENT DOCUMENTS

| | | | |
|---|---|---|---|
| 3,245,794 | 4/1966 | Conley | 430/22 |
| 3,748,975 | 7/1973 | Tarabocchia | 430/5 |
| 3,844,655 | 10/1974 | Johannsmeier | 355/86 |
| 4,052,603 | 10/1977 | Karlson | 355/86 |
| 4,200,668 | 4/1980 | Segal et al. | 427/53.1 |

Primary Examiner—Charles L. Bowers, Jr.
Attorney, Agent, or Firm—Staas & Halsey

[57] ABSTRACT

A method for amending a defective mask pattern of a photomask. A pattern component of a normal mask pattern having the same pattern layout as that of the defective mask pattern to be amended is irradiated by a spotlight. The shape of the spotlight is aligned with the shape of the pattern component which is the same pattern as the component of the defective mask pattern to be amended. At least one base mark is aligned with at least another pattern component near the irradiated portion. Then, the position of the base mark relative to the position of the irradiated portion is fixed. After that, the normal mask pattern is replaced by the defective mask pattern. The base mark is aligned with a pattern component near the defective pattern component in the same manner as the alignment of the normal mask pattern. After that, the spotlight irradiates the defective mask pattern, the luminous intensity of said spotlight being intensified so that it can amend the defective pattern component.

8 Claims, 3 Drawing Sheets

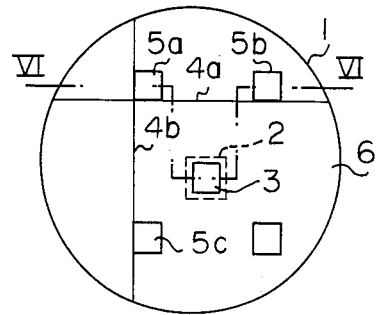
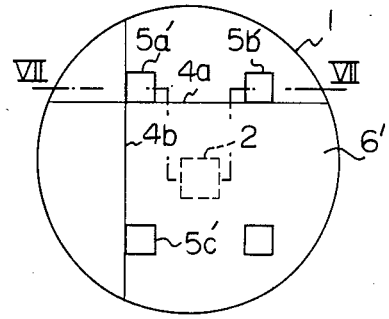
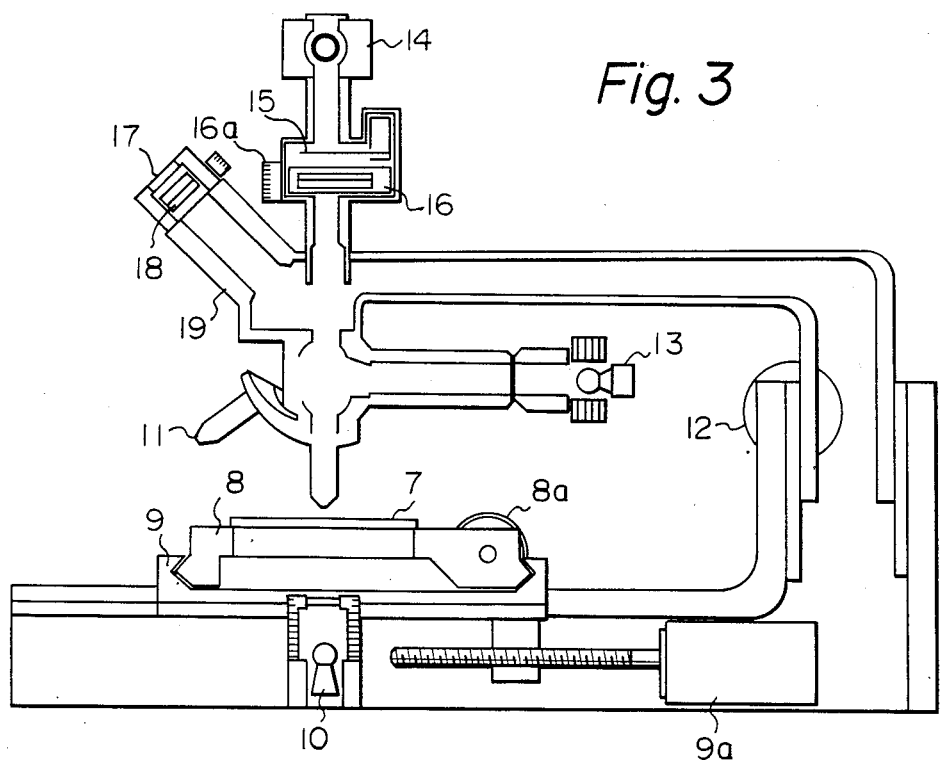

METHOD FOR AMENDING A PHOTOMASK

This is a continuation of co-pending Ser. No. 756,579, filed on July 19, 1985, now abandoned, which is a continuation of Ser. No. 628,115, filed July 5, 1984, now abandoned, which is a continuation of Ser. No. 501,543, filed 6/6/83, now abandoned, which is a continuation of Ser. No. 243,542, filed Mar. 13, 1981, now abandoned.

TECHNICAL FIELD

This invention relates to a method and an apparatus for amending a photomask used in a semiconductor producing process. More particularly, it relates to a method and an apparatus for amending a hard mask made of a hard material.

BACKGROUND OF THE INVENTION

In a process of producing semiconductor devices, a number of semiconductor chips of the same inner pattern are formed on a wafer. The chip pattern, i.e. the inner pattern of the chip, is formed by arranging many pattern components in prescribed positions. Each of the pattern components has, for example, a rectangular shape. Several photomasks are successively used in the process of forming chips on a wafer. The mask pattern layout of the photomask precisely coincides with the chip pattern layout. The wafer is exposed through this photomask and through various successive processes, and semiconductor chips are formed on the wafer. In an example of such a photomask, chromium is coated on a transparent mask plate of glass for forming an opaque pattern layer. Such a photomask is called a hard mask. In a master mask, or a copying mask for actual use composed of the hard mask, a defective portion, such as a portion having an excessive opaque coating or a portion lacking a part of a shape, should be amended. In a conventional method of amendment, first, a photomask to be amended is checked by an automatic inspection device, so as to obtain datum of the position of the defective portion. Then, this photomask is set in an amending apparatus, such as a spot exposure device, and the datum of the position of the defective portion is input into the apparatus so that the defective portion can be amended as follows. The photomask is precoated with a photo-resist agent before the mask is set in the spot exposure device. The spot exposure device contains a microscope. The defective portion of the mask is automatically positioned in the view field of the microscope is accordance with the position datum. The defective portion is viewed by an operator for confirming the shape and the position of the portion. The device comprises an adjustable rectangular aperture through which a light passes so as to irradiate a visible spotlight which does not sensitize the photo-resist on the mask. The size and the position of the rectangular aperture are precisely adjusted so as to correspond to that of the defective portion. Then, an exposure spotlight is irradiated onto the defective portion through the adjusted aperture. After that, the resist agent is developed so as to add or remove the opaque coating at the defective portion.

However, in the above method, the aperture for irradiating the spotlight is positioned by aligning an edge of the rectangular shape of the spotlight with a linear part of the profile of the defective shape of the pattern component. Therefore, it is impossible to amend a defective pattern component if the profile is not clearly defined or if the component is completely omitted, because there is no base line with which an edge of the spotlight can be aligned.

SUMMARY OF THE INVENTION

An object of the present invention is to provide a photomask amending method which makes it possible to easily and precisely amend a defective pattern component, particularly where the shape of the defective pattern component is not clearly defined.

Another object of the present invention is to provide a photomask amending apparatus suitable for achieving the method of the present invention.

To achieve the foregoing objects and in accordance with the present invention, there is provided a method for amending a defective mask pattern of a photomask which comprises a plurality of same mask patterns each of which comprises a plurality of pattern components, this method comprising the steps of:

(a) representing an enlarged image of a normal mask pattern having the same pattern layout as that of the defective mask pattern to be amended in a view field;

(b) irradiating a pattern component of this normal mask pattern by a spotlight;

(c) aligning the spotlight with one of the pattern components of the normal mask pattern, the pattern component corresponding to the pattern component of the defective mask pattern to be amended, so that the shape of the spotlight coincides with that of the one of the pattern components of the normal mask pattern;

(d) representing at least one base mark optically in the view field;

(e) aligning at least one base mark with at least one other pattern component near the irradiated position;

(f) fixing the position of the base mark relative to the position of the irradiated portion in the condition that the sportlight is aligned with the pattern component of the normal mask pattern and the base mark is aligned with the other pattern component near the irradiated portion;

(g) representing the defective mask pattern formed on the same photomask on which the normal mask pattern is formed in the view field by shifting the photomask so as to replace the normal mask pattern with the defective mask pattern;

(h) aligning the base mark with a pattern component near the defective pattern component in the same manner as the alignment of the normal mask pattern, with the base mark being kept fixed with respect to the spotlight in the state of step (f); and (i) irradiating the defective mask pattern with an exposure light having the same shape as that of the spotlight, thereby amending the defective pattern component.

The luminous intensity or the wave length of the spotlight may be changed by using an optical filter so that it can sensitize the photo-resist to amend the defective pattern component.

A photomask amending apparatus for achieving the above method comprises:

a table for mounting a photomask;

a microscope for viewing at least a part of the photomask on the table;

an irradiation device for irradiating a spotlight which shape and position are adjustable onto the photomask in the view field of the microscope;

and, at least one base mark, for example a base line, presented in the view field. The position of the base mark relative to the position of the spotlight is adjustable. The table has a position adjuster mechanism which makes it possible to adjust the position of the photomask relative to the positions of the spotlight and the base mark.

The irradiation device preferably has a light source having a means for changing its luminous intensity or wave length to provide either a visible spotlight incapable of sensitizing the photo-resist or an exposure light for sensitizing the photo-resist.

BRIEF DESCRIPTION OF THE DRAWINGS

FIG. 1 and FIG. 2 represent view fields of the microscope used in the method according the the present invention.

FIG. 3 is a side view of a spotlight exposure device according to the present invention.

DETAILED DESCRIPTION OF PREFERRED EMBODIMENTS

Figure 4:
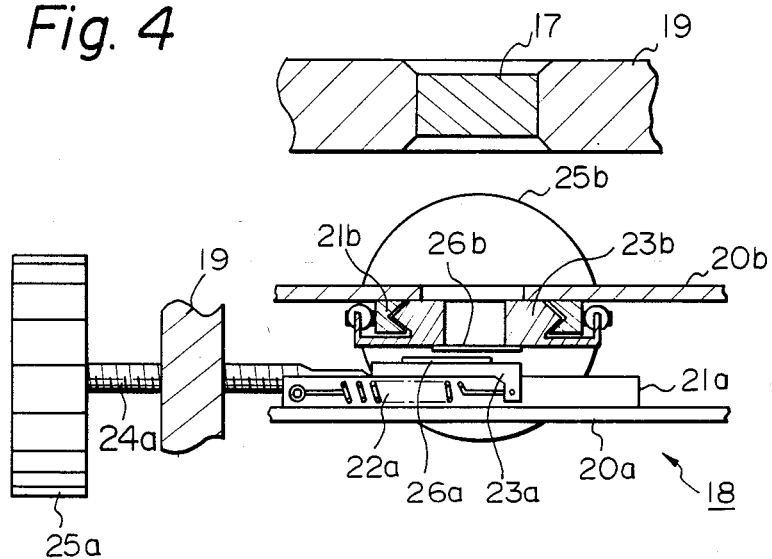
FIG. 4 is a detailed view of a base line adjuster installed in the spotlight exposure device of FIG. 3.

The amending method of the present invention will be described hereinafter in the case of amending a defective pattern component of a chromium photomask which component does not have a clearly defined profile. An example is a defective photomask in which each of the pattern components is a rectangular opening in an opaque coating and one of the components is completely missing.

First, the photomask is examined by an automatic mask inspection device so as to make a datum of the defective position where the pattern component is omitted. After that, a positive photo-resist agent is coated on the photomask which is, then, set in a spotlight exposure device. The datum of the defective position is input into the spotlight exposure device so that the defective potion is within the view field of a microscope which is provided in this spotlight exposure device. The defective portion is viewed and confirmed by an operator. After that, a normal mask pattern 6 which is, for example, adjacent to the defective mask pattern is manually presented in the view field, such as shown in FIG. 1. This normal mask pattern 6 has already been checked by the automatic mask inspection device and judged as being normal. As illustrated in FIG. 1, the pattern component 3 which is an opening is presented in the view field 1 of the microscope. This pattern component 3 is omitted in the defective chip pattern 6', such as shown in FIG. 2, to be amended. A visible rectangular spotlight 2, represented by a dotted line, to which the resist agent is not sensitive is overlapped on the pattern component 3. The luminous intensity of this spotlight is weak or its minimum wave length is limited so as not to act upon the resist agent on the photomask. Each edge of the spotlight 2 must be precisely aligned with each edge of the rectangular pattern component 3. In the drawing, the spotlight 2 is illustrated as being larger than the pattern component 3 for easy understanding of the drawing. However, actually the shape and the position of the spotlight 2 must coincide with those of the pattern component 3. The perpendicularly disposed two base lines 4a, 4b are presented in the view field 1 of the microscope. Each of the base lines 4a, 4b can be moved and fixed independently. The base line 4a is aligned with edges of the pattern components 5a, 5b located near the pattern component 3. The other base line 4b is aligned with edges of pattern components 5a, 5c. The base lines 4a, 4b are fixed after alignment. Also, the relative position of the base lines 4a, 4b with respect to the position of the spotlight 2 is fixed. after that, as illustrated in FIG. 2, the defective mask pattern 6' is again presented in the view field 1 of the microscope manually. In the view field 1, there are presented pattern components 5a', 5b', 5c' of the mask pattern 6', which components correspond to the pattern components 5a, 5b, 5c, respectively, of the normal mask pattern 6. The photomask is positioned so that the edges of the pattern components 5a', 5b' precisely align with the base line 4a which is fixed in the view field 1 and the edges of the pattern components 5a', 5c' precisely align with the base line 4b which is also fixed in the view field 1. In this situation, the spotlight 2 fixed in the view field 1 is precisely located at the position where the omitted pattern component is to be formed. Then, an amending spotlight for sensitizing the photo-resist, which spotlight has the same shape and position as that of the above spotlight 2, is irradiated onto this chip pattern 6' which is formed by an opaque chromium coating. This amending spotlight has a sufficient luminous intensity or a sufficiently short wave length for acting upon the resist agent on the chip pattern 6'. Then, the development process is conducted so that the exposed portion of the resist agent is removed. Then, the chromium coating is etched through this removed portion of the resist agent so that an opened pattern component is formed on the opaque coating.

The method of the present invention can also be used for amending a photomask in which an opaque pattern component is omitted from the transparent base plate. In this case, the amending process is substantially the same as that of the aforementioned example, except the process after the exposure of the resist agent. The exposed portion of the resist agent is removed from the glass base plate by a development process. Then, chromium is coated over the photomask by a conventional vacuum evaporation method. After that, the remaining resist agent is entirely removed with the chromium coating thereon. Therefore, the chromium coating remains only at the portion exposed by the spotlight since the chromium is coated directly on the glass plate at that portion. In this way, a chromium opaque pattern component is formed on the glass plate.

A photomask amending apparatus for achieving the above mentioned method will be described hereinafter. A spotlight exposure device for amending a photomask according to the present invention is illustrated in FIG. 3. A photomask 7 to be amended is mounted on an X-table 8 connected to a drive motor 8a which drives the X-table in the X-direction, i.e. perpendicular to this drawing sheet. This X-table is mounted on a Y-table 9 connected to a drive motor 9a which drives the Y-table in the Y direction, i.e. in the left and right direction in the drawing. A light source 10 is provided under the Y-table 9 for illuminating the photomask 7 from the under side. A set of object lenses 11 is provided on body 19 of the device above the X-table 8. The object lens 11 is moved vertically by rotating a knob 12 so as to adjust the focus. Another light source 13 is provided on the device body 19 for illuminating the photomask 7 from the upper side. These light sources 10 and 13 provide illumination lights to which the photo-resist agent is not sensitive. A light source 14 for spot irradiation is mounted on the device body 19. A shutter 15 having an optical filter and an aperture mechanism 16 are installed in the beam passage from the light source 14. The luminous intensity of the light from the light source 14 can be changed by inserting the optical filter of the shutter 15 into the beam passage so that the intensity is weak at the time of aligning the spotlight with the normal pattern component, while the intensity is strong at the time of exposing the resist agent on the defective pattern component by the direct light from the light source 14. Alternatively, the optical filter may be of the type capable of blocking only the shorter wave length light component, i.e. the ultra-violet component of the light beam from the source 14, to which the photo-resist is sensitive. The aperture mechanism 16 has a rectangular opening (not shown) through which the light passes. The length and breadth of the opening can be adjusted by two knobs 16a for adjusting the length and the breadth, respectively, though only one knob 16a is illustrated in the drawing. An eye lens 17 is secured to the device body 19. A base mark adjuster 18 is installed beneath the eye lens 17.

Figure 5:
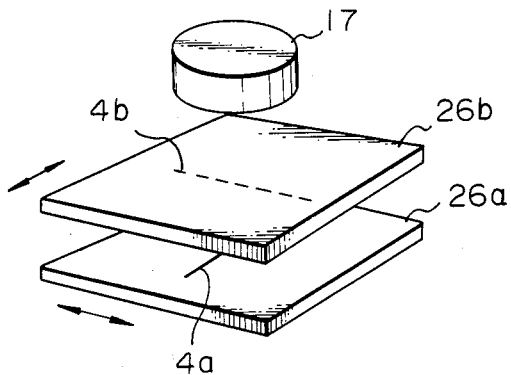
FIG. 5 is a perspective view of a part of the base line adjuster.

The construction of the base mark adjuster 18 is illustrated in FIGS. 4 and 5. A base line 4a for the X direction is marked on an upper surface of a lower transparent plate 26a (FIG. 5). Another base line 4b for the Y direction is marked on a lower surface of an upper transparent plate 26b. The transparent plate 26a with the base line 4a is mounted on a movable stage 23a which is slidable on a stable stage 21a on a base plate 20a by rotating a knob 25a. A spring 22a always forces the movable stage 23a in one direction for smooth movement of the stage 23a and for removing the back lash of a screw 24a. Each of the base plate 20a and the stages 21a, 23a has an opening through which the base lines can be seen. The arrangement of the base line 4b in the Y direction is substantially the same as that of the above mentioned base line 4a in the X direction.

Figure 6:
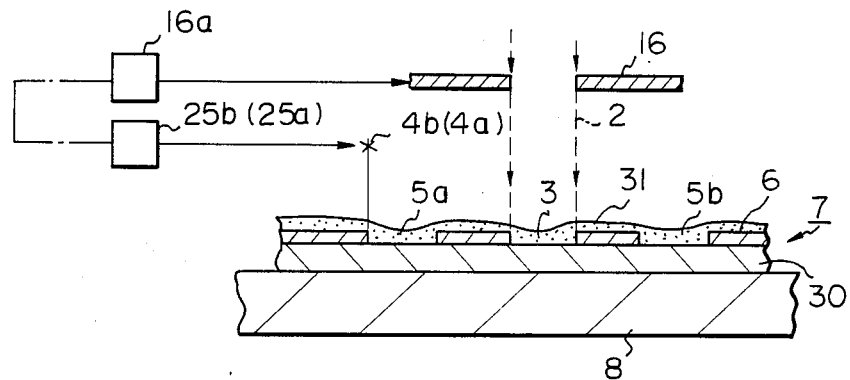
FIG. 6 is a schematic view of the spotlight adjustment and base line adjustment steps along with a sectional view taken along the line VI—VI in FIG. 1.
Figure 7:
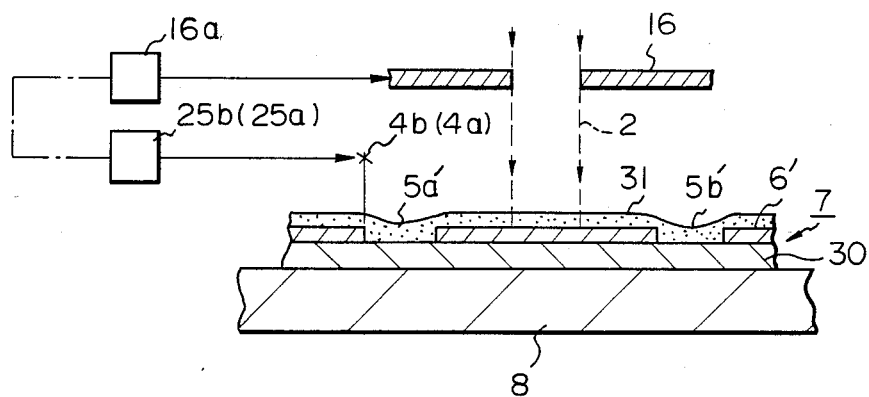
FIG. 7 is a schematic view of the spotlight adjustment and base line adjustment steps along with a sectional view taken along the line VII—VII in FIG. 2.

A photomask is amended by the above mentioned spotlight exposure device as follows. First, the photomask is set in an automatic mask inspection device (not shown) so as to obtain datum of the position of the defective portion. Then, the photomask 7 (FIG. 3) is mounted on the X-table 8 of the spotlight exposure device. The datum of the portion of the defective portion is input to a control unit (not shown) of this spotlight exposure device, so that the drive motors 8a and 9a are driven to automatically locate the defective portion within the view field of the microscope. These operations may be done manually without the automatic mask inspection device. The defective portion is confirmed at this stage through the eye lens 17. Then, the defective mask pattern is replaced by a normal mask pattern which is, for example, adjacent to the defective mask pattern by a manual operation mechanism (not shown). The normal portion which corresponds to the defective portion of the defective mask pattern is presented within the view field. This situation is illustrated in FIG. 6. The photomask 7 comprises a normal mask pattern 6 of chromium. A positive photo-resist agent 31 is coated on the mask pattern 6 which comprises pattern components 3, 5a, 5b, each of which is an opening in the chromium pattern 6. The omitted pattern component in the defective mask pattern corresponds to the pattern component 3 of this normal mask pattern 6. By rotating the knobs 16a, the shape and the position of the visible spotlight 2 through the shutter 15 and the aperture mechanism 16 can be made to precisely coincide with those of the pattern component 3. The aperture mechanism 16 is fixed so as to maintain this situation. By rotating the knobs 25a, 25b, the base lines 4a, 4b are aligned with the edges of the opened pattern components 5a, 5b, 5c as shown in FIG. 1. The base lines 4a, 4b are fixed at these positions, respectively. In this situation, the location of the base lines 4a, 4b is fixed relative to the location of the spotlight 2. After that, the X-table 8 and the Y-table 9 are moved so as to present the defective mask pattern 6' within the view field (FIGS. 2 and 7). The opened pattern components 5a', 5b', 5c' around the omitted pattern component are aligned with the base lines 4a, 4b in the same alignment as the pattern components 5a, 5b, 5c with the base line 4a, 4b. Thereby, the profile and the position of the spotlight 2 precisely coincide with the pattern component which is to be formed. Then, by removing the shutter 15 from the beam passage, the luminous intensity of the spotlight 2 is intensified or the spotlight 2 is changed to include ultra-violet light so as to act upon the resist agent 31. Then, the resist agent 31 is developed and the exposed portion thereof is removed. After that, the chromium layer at the portion where the resist agent is removed is etched, so as to form an opened pattern component.

In the above embodiment, the present invention is described with reference to a chromium hard mask. However, the present invention can be also applied to any hard mask other than the chromium hard mask.

Any normal chip pattern on the photomask may be used when the base lines and the spotlight are aligned with the normal pattern elements. A normal chip pattern of another photomask may also be used in place of the normal chip pattern of the photomask having the defective chip pattern to be amended.

The opaque coating layer of chromium on the mask plate may be removed by a laser beam instead of the etching process. The laser beam is irradiated through the aperture mechanism which forms the spotlight described above.

As mentioned above, in accordance with the present invention, the photomask can be amended easily and reliably, even though the profile of the defective pattern component is not clearly defined. Therefore, the percentage of photomasks of a good quality increases and production costs can be reduced due to the decrease of defective photomasks.

I claim:

1. A method for amending a defective mask pattern of a photomask which comprises a plurality of same mask patterns each of which comprises a plurality of pattern components, this method comprising the steps of:
    (a) representing an enlarged image of a normal mask pattern having the same pattern layout as that of the defective mask pattern to be amended in a view field;
    (b) irradiating a pattern component of said normal mask pattern by a spotlight;
    (c) aligning said spotlight with one of the pattern components of said normal mask pattern, said one of the pattern components corresponding to the pattern component of the defective mask pattern to be amended, so that the shape of said spotlight coincides with that of the one of the pattern components of said normal mask pattern;

(d) representing at least one base mark optically in said view field said base mark including first and second independently movable base lines;

(e) aligning at least one base mark with at least one pattern component near the irradiated portion while said normal mask pattern is irradiated by the spotlight;

(f) fixing the position of said base mark relative to the position of said irradiated portion in the condition that said spotlight is aligned with the pattern component of sid normal mask pattern and said base mark is aligned with said one pattern component near the irradiated portion;

(g) representing the defective mask pattern formed on the same photomask on which said normal mask pattern is formed in said view field by shifting said photomask so as to replace the normal mask pattern with said defective mask pattern;

(h) aligning said base mark with a pattern component near the defective pattern component in the same manner as the alignment of the normal mask pattern, with the base mark being kept fixed with respect to the spotlight in the state of step (f); and (i) irradiating the defective mask pattern with an exposure light having the same shape as that of said spotlight, thereby amending the defective pattern component.

2. A photomask amending method according to claim 1, in which said spotlight is derived from a light source through an optical filter.

3. A photomask amending method according to claim 2, in which said exposure light exposes a resist agent coated on said photomask so as tom amend the defective pattern component.

4. The method of claim 2, wherein the exposure light is derived from the same light source and optical filter as said spotlight.

5. A photomask amending method according to claim 1, in which a laser beam is used as said exposure light.

6. The method of claim 1, wherein the defective photomask pattern comprises a hard mask.

7. The method of claims 1 or 6, wherein the defective mask pattern has a pattern component omitted.

8. The method of claim 1 or 6, wherein the defective mask pattern has a component to be amended having no clearly defined profile.

* * * * *